(12) United States Patent
Yap

(10) Patent No.: US 9,780,077 B2
(45) Date of Patent: Oct. 3, 2017

(54) SYSTEM-IN-PACKAGES CONTAINING PREASSEMBLED SURFACE MOUNT DEVICE MODULES AND METHODS FOR THE PRODUCTION THEREOF

(71) Applicant: FREESCALE SEMICONDUCTOR INC., Austin, TX (US)

(72) Inventor: Weng F. Yap, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/850,544

(22) Filed: Sep. 10, 2015

(65) Prior Publication Data
US 2017/0077072 A1 Mar. 16, 2017

(51) Int. Cl.
*H01L 25/10* (2006.01)
*H01L 21/78* (2006.01)
*H01L 25/00* (2006.01)

(52) U.S. Cl.
CPC ............ *H01L 25/105* (2013.01); *H01L 21/78* (2013.01); *H01L 25/50* (2013.01); *H01L 2225/1023* (2013.01); *H01L 2225/1041* (2013.01); *H01L 2225/1058* (2013.01)

(58) Field of Classification Search
CPC .......... H01L 23/3135; H01L 23/49537; H01L 23/49575; H01L 23/49531; H01L 24/73; H01L 23/49562; H01L 2224/48091; H01L 2224/48247; H01L 2924/01079; H01L 2924/13055; H01L 21/304; H01L 23/29; H01L 23/00; H01L 21/56; H01L 23/495; H01L 2224/73265; H01L 2924/01078
See application file for complete search history.

(56) References Cited

U.S. PATENT DOCUMENTS

| | | | |
|---|---|---|---|
| 7,583,512 B2 | 9/2009 | Ryu et al. | |
| 8,830,689 B2 | 9/2014 | Kim et al. | |
| 2005/0011672 A1* | 1/2005 | Alawani | H05K 3/284 174/260 |
| 2005/0288392 A1* | 12/2005 | Okubora | H01L 23/04 523/176 |
| 2006/0281230 A1* | 12/2006 | Brandenburg | H01L 23/3121 438/127 |
| 2013/0154091 A1 | 6/2013 | Wright et al. | |

* cited by examiner

Primary Examiner — Roy Potter

(57) ABSTRACT

Methods for producing System-in-Packages (SiPs) containing embedded Surface Mount Device (SMD) modules are provided, as SiPs containing SMD modules. In one embodiment, the fabrication method includes positioning a semiconductor die and first preassembled SMD module, which contains a plurality of SMDs soldered to an interposer substrate, in predetermined spatial relationship. The preassembled SMD module and the semiconductor die are overmolded to yield a molded panel having a frontside at which the first preassembled SMD module and the semiconductor die are exposed. A Redistribution Layer (RDL) structure can be formed over the frontside of the molded panel containing interconnect lines electrically coupling the semiconductor die and the first preassembled SMD module. The molded panel may then undergo singulation to produce an SiP having a molded body in which the semiconductor die and the first preassembled SMD module are embedded.

19 Claims, 5 Drawing Sheets

SYSTEM-IN-PACKAGES CONTAINING PREASSEMBLED SURFACE MOUNT DEVICE MODULES AND METHODS FOR THE PRODUCTION THEREOF

TECHNICAL FIELD

Embodiments of the present invention relate generally to microelectronic packaging and, more particularly, to System-in-Packages and methods for fabricating System-in-Packages containing preassembled surface mount device modules.

BACKGROUND

A microelectronic package containing one or more semiconductor die electrically interconnected with multiple discrete components is commonly referred to as a "System-in-Package" or "SiP." The discrete components are typically Surface Mount Devices (SMDs), such as discrete resistors, capacitors, inductors, and diodes. The SiP can be produced as a Fan Out Wafer Level Package (FO-WLP). In one example of a FO-WLP packaging approach, semiconductor die are positioned on a temporary substrate in predetermined groupings with the SMDs. A panelization or overmolding process is then carried-out to encapsulate the die and SMDs in a molded panel. Redistribution Layers (RDLs) containing metal interconnect lines are produced over the frontside of the molded panel to provide the desired wiring structure between the die and the SMDs. A Ball Grid Array (BGA) or another contact array can then be produced over the RDLs and in electrical contact with the interconnect lines to provide externally-accessible points of contact to the microelectronic devices (e.g., semiconductor die and SMDs) embedded in the panel body. Additional processes can be performed, as desired, to impart the FO-WLPs with various other features, such as a backside contact array, heat sink, radio frequency (RF) shield, or the like. Lastly, the panel is singulated to yield a plurality of SiPs each including a molded package body containing at least one semiconductor die interconnected with at least one and typically multiple SMDs.

As SiP complexity increases, it is not uncommon for a single SiP to contain a relatively large number of discrete SMDs interconnected with one or more semiconductor die contained within a molded package body. For example, certain SiP Single Chip Modules (SCMs) are currently produced containing over one hundred discrete SMDs, which are positioned throughout the module and interconnected with a semiconductor die when the SiP is complete. When a molded panel FO-WLP fabrication process is utilized to produce the SiP, the SMDs and other microelectronic components (e.g., semiconductor die) can be placed on a temporary substrate utilizing a pick-and-place tool. Placement of the microelectronic components is typically carried-out sequentially on a one-by-one basis. If not placed with sufficient accuracy, the SMDs may be offset from their desired positions within the molded panel; and subsequently-produced interconnect lines may fail to contact the terminals of the misplaced SMDs during RDL build-up. Failure to establish electrical contact with one or more SMDs can result in rejection of the entire SiP upon testing. Pre-panelization placement of the SMDs is therefore carefully performed and can be a time consuming process. In the aggregate, SMD placement can take several minutes for SiPs containing a relatively large number of SMDs, and the better part of a day for molded panels containing relatively large numbers of SiPs produced in parallel.

BRIEF DESCRIPTION OF THE DRAWINGS

At least one example of the present invention will hereinafter be described in conjunction with the following figures, wherein like numerals denote like elements, and.

Figure 1:
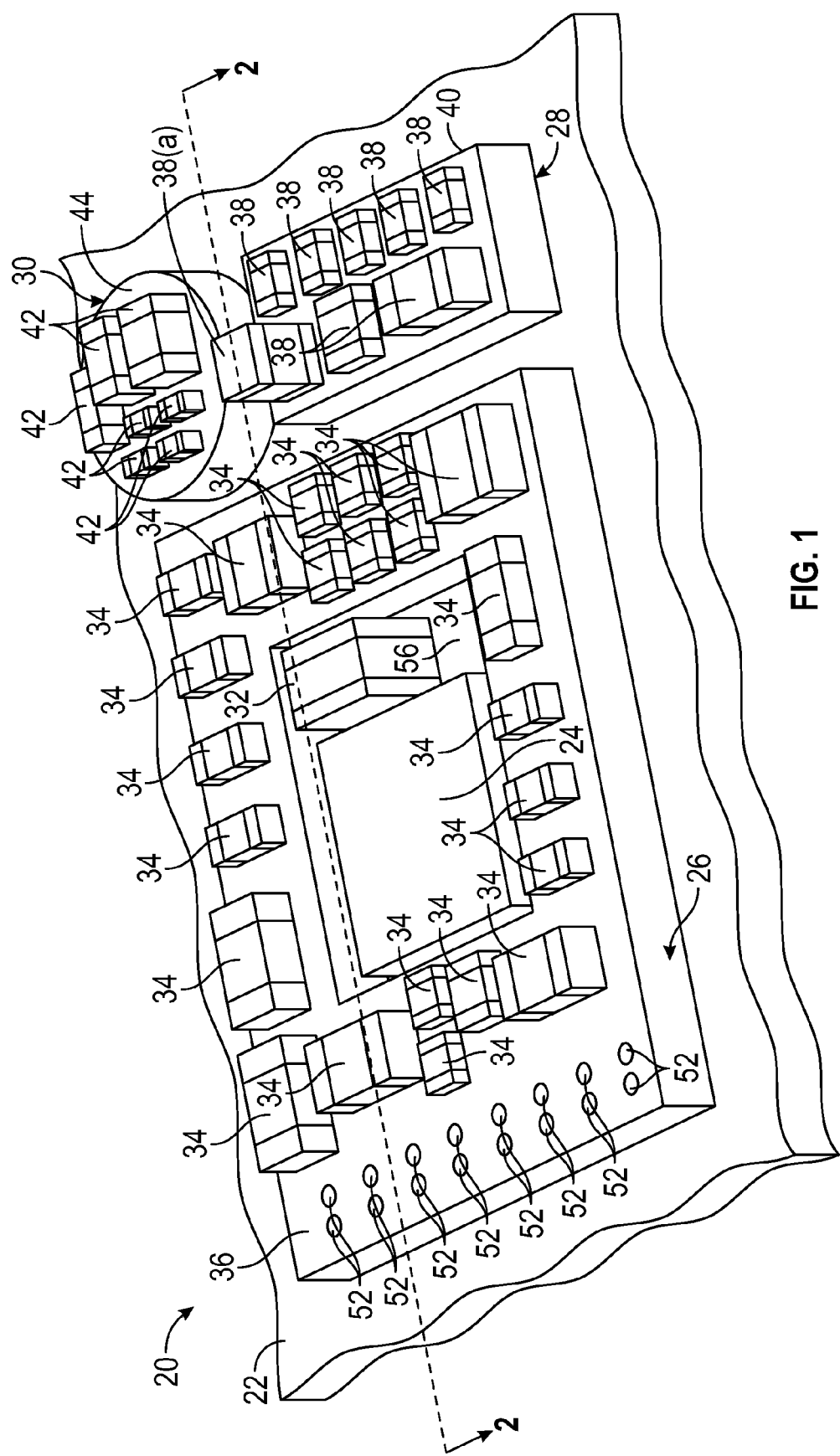
FIG. 1 is an isometric view of a plurality of preassembled Surface Mount Device modules and other microelectronic components placed on a temporary substrate (partially shown) in a predetermined grouping and utilized to produce a System-in-Package (SiP), as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

There exists an ongoing need to provide methods for fabricating System-in-Packages (SiPs) containing multiple Surface Mount Devices (SMDs), which can be performed with greater efficiency and at reduced costs, while ensuring highly accurate SMD placement and improved package throughput. Embodiments of such a fabrication method are provided herein, as are embodiments of SiPs produced pursuant to such fabrication methods.

Embodiments of the below-described SiPs leverage preassembled SMD modules to reduce the duration and cost of pre-panelization placement, while further promoting highly accurate placement of the larger modules and, therefore, the SMDs carried thereby. Each preassembled SMD module can include multiple SMDs soldered or otherwise electrically joined to a routed interposer substrate (referred to herein as an "interposer"). The SMD modules are "preassembled" in that each module is produced prior to the SiP fabrication process and, specifically, prior to pre-panelization placement of the SMDs modules and other microelectronic components. Production of the preassembled SMD modules can be performed by the SiP manufacturer itself or by a third party supplier, such as Printed Circuit Board (PCB) assembly house. The preassembled SMD modules are advantageously tested to ensure proper operation prior to integration into the larger SiP. A given SiP can be produced to include any number of SMD modules, which can each carry any number of SMDs. By integrating such SMD modules into an SiP, the need to precisely place individual SMDs can be eliminated or minimized. The duration and cost of SiP manufacture can be reduced as a result.

Embodiments of the SiP fabrication method can provide additional benefits beyond reducing manufacturing time and cost. For example, due in part to their increased size as compared to a single SMD, a preassembled SMD module can often be positioned with greater accuracy to reduce the likelihood of routing disconnect failures and improve package throughput. Furthermore, in embodiments wherein soldering is utilized to mount the SMDs to the interposer substrate of a given SMD module, the SMD terminals will tend to self-align to the routing features of the interposer during solder reflow to ensure high integrity electrical contact between the SMDs and the interposer. As a still further advantage, the SMD modules can be produced to have a wide variety of shapes and dimensions to provide a high level of design flexibility allowing the SMD modules to be utilized across different SiP platforms in an interchangeable or highly modular basis. Additionally, the usage of such SMD-populated interposer substrates can ease the material constraints placed on the SMD termination finishes that can otherwise be imposed by the panelization process; e.g., SMDs terminated in tin (Sn) or another non-precious metal can be utilized, which tend to be less costly and more readily available than are SMDs terminated in gold (Au), copper (Cu), and other such materials. Finally, as a yet another advantage, high profile electrically-conductive members (e.g., solder balls or larger SMDs) can be positioned or formed at selected locations on the interposer of an SMD module to provide electrically-conductive paths extending between the frontside and backside of the molded package body of the completed SiP. An exemplary embodiment of a SiP containing number of SMD modules and a method for producing the SiP will now be described in conjunction with FIGS. 1-7.

FIGS. 1-7 illustrate an SiP 20 at various stages of manufacture and shown in accordance with an exemplary embodiment of the present invention. In this particular example, SiP 20 is produced utilizing a molded panel Fan-Out Wafer Level Package (FO-WLP) process wherein a molded panel (e.g., molded panel 64 partially shown in FIGS. 4-6) is produced, processed, and then singulated in to yield SiP 20 in its completed form along with a number of additional completed SiPs. The other SiPs produced pursuant to the below-described fabrication process may or may not be substantially identical to SiP 20; however, the process steps described herein will typically be performed globally across the molded panel and are consequently generally descriptive of the processing of the panel, as a whole. In further embodiments, the SMD module-containing SiP can be produced utilizing other non-molded panel fabrication techniques.

Figure 2:
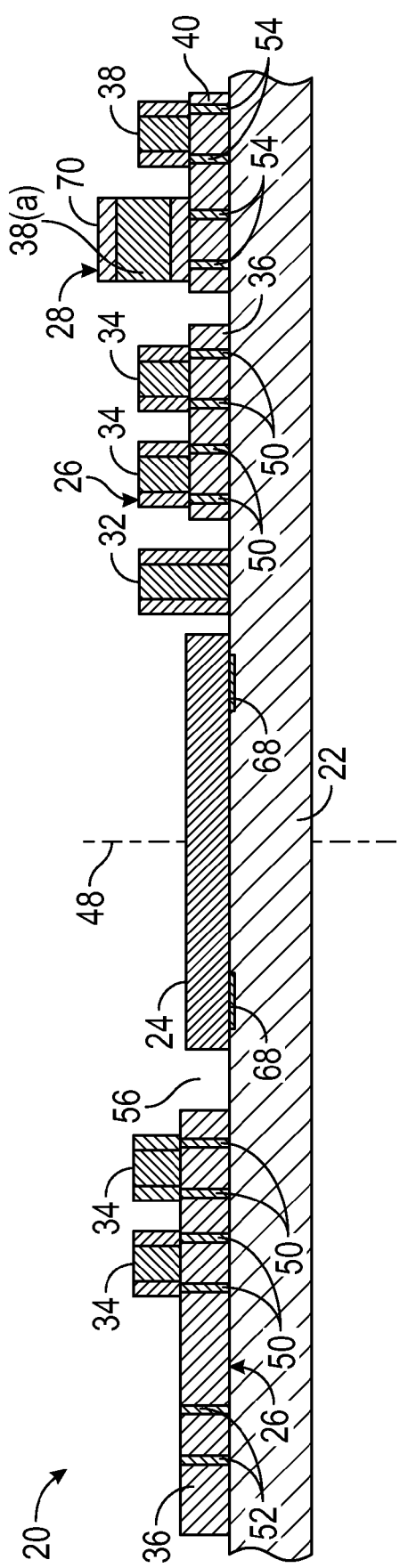
FIGS. 2-7 are cross-sectional views of the partially-fabricated SiP shown in FIG. 1, as illustrated at various stages of a exemplary manufacturing process.

Referring initially to FIGS. 1 and 2, production of SiP 20 commences with the placement of a number of microelectronic devices in predetermined groupings on a temporary substrate 22 (partially shown). Each grouping can include at least one semiconductor die and at least one SMD module. Only one microelectronic device grouping is shown in FIGS. 1-2, namely, the grouping of devices to be included within SiP 20, when completed. This grouping includes a semiconductor die 24, a first SMD module 26, a second SMD module 28, a third SMD module 30 (shown in FIG. 1 only), and an individually-placed SMD 32. This illustrated grouping is provided purely by way of example. In further embodiments, additional SMD modules, semiconductor die, individually-placed SMDs, and various other microelectronic components (e.g., prefabricated via structures, prefabricated antenna structures, optical devices, Microelectromechanical systems (MEMS) devices, and so on) can be placed in the predetermined grouping in addition to or in lieu of the aforementioned modules and devices. Furthermore, it will be appreciated that temporary substrate 22 is considerably larger than the illustrated portion, and that a relatively large number of semiconductor die, SMD modules, individually-placed SMDs, and other such microelectronic components are distributed over the upper surface of substrate 22 in various additional device groupings corresponding to the other SiPs produced in parallel with SiP 20.

SMD modules 26, 28, and 30 each contain multiple discrete SMDs (also referred to as "passives" or simply "discretes"). Specifically, SMD module 26 contains a relatively large number of SMDs 34, which are supported or carried by an interposer 36. SMD module 28 contains a moderate number of SMDs 38, which are supported or carried by an interposer 40. Finally, SMD module 30 likewise contains a moderate number of SMDs 42, which are supported or carried by an interposer 44. SMD modules 26, 28, and 30 carry a total of thirty eight discrete SMDs in the illustrated example. In further embodiments, SiP 20 can include a fewer or a greater number of SMD modules, which can each be populated by any number of discrete SMDs exceeding one. In further embodiments, SiP 20 can be produced to include an even greater number of SMDs than in the illustrated example (e.g., one hundred or more SMDs), some or all of which can be carried by SMD modules of the type described herein. SMD modules 26, 28, and 30 are advantageously tested to ensure proper operation prior to placement on temporary substrate 22 and performance of the below-described overmolding or panelization process.

SMDs 34, 38, and 42 can be any combination of discrete or passive resistors, capacitors, inductors, diodes, or the like. For example, as indicated in FIGS. 1 and 2, SMDs 34, 38, and 42 can each assume the form of a two-terminal chip capacitor, a two-terminal chip inductor, or a two-terminal chip resistor having a generally rectangular form factor as viewed from the side, top, or bottom. In this regard, SMDs 34, 38, and 42 can include electrically-conductive end terminals, which may flank an electrically-insulative (e.g., ceramic) body in an embodiment. The terminals of SMD 34, 38, and 42 are composed of an electrically-conductive material and can have various different surface finishes, such as tin, copper, gold, nickel, conductive epoxy, palladium, silver, and lead-based finishes, to list but a few examples. Notably, as SMDs 34, 38, and 42 are joined to the routing features of interposers 36, 40, and 44, the material constraints often imposed on the SMD termination finishes when utilizing molded panel fabrication processes are eased allowing the usage of SMDs terminated in readily available, lower cost materials, such as Sn.

SMDs 34, 38, and 42 can be soldered or otherwise electrically joined to interposers 36, 40, and 44, respectively, in any desired arrangement and orientation. SMDs 34, 38, and 42 will typically be disposed in a horizontal orientation; that is, such that the longitudinal axis of the SMD is substantially orthogonal to plane containing the centerline of SiP 20 (represented in FIG. 2 by dashed line 48). However, certain SMDs 34, 38, and/or 42 can be disposed in a vertical orientation; that is, such that the longitudinal axis of the SMD is substantially parallel to SiP centerline 48. One such SMD is shown in FIG. 1, contained within preassembled SMD module 28, and identified by reference numeral "38($a$)." Additionally, it can be seen that SMD 38($a$) has increased height or profile relative to the other SMDs 34, 38, and 42. This facilitates exposure of the upper terminal of SMD 38($a$) (referred to hereafter as "high profile SMD 38($a$)") during a subsequently performed panel thinning (e.g., back grinding) process to allow SMD 38(*a*) and its associated interposer routing feature or features to collectively form an electrically-conductive path or via through the molded body of SiP 20, when completed as described below.

Interposers 36, 40, and 44 each include a dielectric body or substrate in which or on which electrically-conductive (e.g., metal) routing features are formed. In the illustrated example, the interposer routing features assume the form of metal plated or conductor-filled vias extending through the respective dielectric bodies of interposers 36, 40, and 44. SMDs 34, 38, and 42 are electrically joined to some or all of the routing features included within interposers 36, 40, and 44, respectively; the term "electrically joined," as appearing herein, denoting both an electrical and mechanical joint or connection. In other embodiments, the routing features assume other forms or include other electrically-conductive features, such as metal (e.g., copper) traces. In the case of preassembled SMD module 26, specifically, SMDs 34 are electrically joined to a first group of routing features 50, such as plated or conductor filled vias, provided on interposer 36; the term "on," as appearing herein, also encompassing the term "in" and "through" when utilized in reference to the routing features of an interposer substrate. Routing features 50 underlie the respective terminals of SMDs 34 and, thus, cannot be seen in FIG. 1. However, a subset of routing features 50 is shown in FIG. 2. Additionally, SMD module 26 further includes a second group of routing features 52, which are not covered by and interconnected with SMDs 34. Routing features 52 are instead maintained in an unoccupied or available state at the present manufacture juncture to allow connection to other microelectronic devices, components, or electrically-conductive bodies. For example, solder balls or other electrically-conductive bodies can be deposited over the exposed terminal ends of routing features 52 to form conductive paths or vias through the subsequently-produced molded package body, as described more fully below. When provided, such unoccupied spaces or "slots" with available routing on SMD module 26 or another SMD module can thus provide a higher level of manufacturing flexibility.

With continued reference to FIGS. 1 and 2, preassembled SMD modules 28 and 30 include routing features similar to those of preassembled SMD module 26. Specifically, preassembled SMD module 28 further includes routing features 54 (e.g., plated or conductor filled vias) provided through interposer 36. Routing features 54 are covered by SMDs 38 and cannot be seen in FIG. 1; however, a small number of routing features 54 can be seen in FIG. 2. Finally, preassembled SMD module 30 likewise includes plated vias, conductor filled vias, and/or other such routing features provided in, through, or on interposer 36. While these routing features hidden from view in FIGS. 1 and 2, it will be appreciated that such routing features may be substantially identical to illustrated routing features 50 and 54 and, therefore, the following description applies equally thereto. While carrying only SMDs in the illustrated example, preassembled SMD assemblies 26, 28, and 30 can carry other microelectronic components and devices in addition to SMDs 34, 38, and 42 in further embodiments. Such devices include, but are not limited to, prefabricated via structures, prefabricated antenna structures, MEMS devices, and optical devices, to list but a few examples.

During production of SMD modules 26, 28, and 30, SMDs 34, 38, and 42 can be electrically joined to respective interposers 36, 40, and 44 in any manner that provides both a mechanical coupling to the interposer substrate and an electrical connection to the appropriate electrically-conductive routing features of the interposer. For example, in certain embodiments, one or more of SMDs 34, 38, and 42 can be electrically joined to interposers 36, 40, and 44 utilizing an electrically conducive adhesive, such as a metal-filled epoxy. It is preferred, however, that SMDs 34, 48, and 42 are soldered to interposers 36, 40, and 44, respectively. Soldering processes suitable for mounting SMDs 34, 48, and 42 to respective interposers 36, 40, and 44 are known and entail the application of a solder material (e.g., a solder paste or flux) to the SMD terminals and/or to the interposer routing features, positioning the SMDs at their desired location on the interposer support surfaces (the upper surfaces of interposers 36, 40, and 44 in the orientation shown in FIGS. 1 and 2), and carrying-out a solder reflow process. In one exemplary approach, the solder material is applied to the electrically-conductive end terminals of SMDs 34, 38, and 42 by dipping. In another exemplary approach, a pin transfer technique is utilized to dispense a flux/solder paste onto the routing features present on the support surfaces of interposers 36, 40, and 44. In further embodiments, other methods can be utilized to apply solder material to selected areas of the SMD terminals and/or the interposer routing features. Notably, the solder process will often have an inherent self-aligning effect, which may help correct misalignments between the SMD terminals and the interposer routing features; thus, placement of SMDs 34, 48, and 42 on their respective interposers 36, 40, and 44 can be carried-out will less stringent tolerances than would otherwise be required during pre-panelization placement of individual SMDs.

SMD modules 26, 28, and 30 can be produced to have any shape and dimensions suitable for supporting multiple SMDs and for integration into a SiP, such as SiP 20 (FIGS. 1 and 2). To further emphasize this point, and as shown most clearly in FIG. 1, SMD module 26 (and specifically interposer 36) is illustrated as having polygonal (e.g., square) ring-shaped geometry defining a opening or die cavity 56 into which other components, such as die 24 and individually-placed SMD 32, can be positioned. Imparting SMD module 26 with such a ring-shaped geometry can be useful in embodiments wherein it is desired to surround a semiconductor die with an array of SMDs, as generally shown in FIG. 1. By comparison, SMD module 28 (and specifically interposer 40) is imparted with a block shaped geometry, while SMD module 30 (and specifically interposer 44) is imparted with an elliptical (e.g., circular) shaped geometry. In still further embodiments, SMD modules 26, 28, and 30 can be imparted with still other planform geometries, such as L-shaped, O-shaped, or U-shaped planform shapes. The planform shape of the SMD module or modules integrated into a given SiP is thus readily adaptable to a given SiP design or layout. This is highly useful.

During pre-panelization placement, SMD modules 26, 28, and 30 are each positioned on temporary substrate 22 such that their lower surfaces (that is, the surfaces of interposers 36, 40, and 44 opposite SMDs 34, 38, and 42, respectively) contact substrate 22. The above-described routing features (e.g., plated or conductor filled vias) of interposers 36, 40, and 44 are exposed at the respective lower surfaces of SMD modules 26, 28, and 30 and thus also contact temporary substrate 22. By comparison, semiconductor die 24 is inverted and positioned facedown when placed on substrate 22 such that bond pads 68 of die 24 are placed in contact with substrate 22. Finally, individually-placed SMD 32 is positioned in a horizontal orientation such that its conductive end terminals both contact substrate 22. In the illustrated example, die 24 and individually-placed SMD 32 are both positioned within die cavity 56 in a side-by-side relationship. In further embodiments, semiconductor die 24 and SMD 32 can be positioned elsewhere with respect to SMD modules 26, 28, and 30; and/or additional die or individually-positioned SMDs can be placed on temporary substrate 22 along with die 24 and SMD 32.

Figure 3:
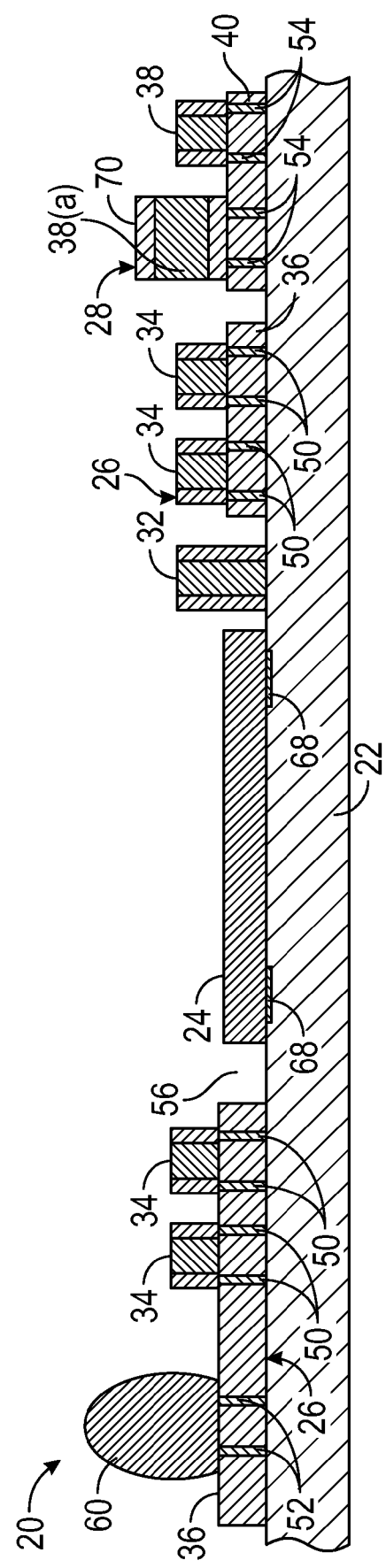

In embodiments wherein via conductors are desirably provided through the molded package body of SiP 20, when completed, electrically-conductive bodies can be deposited, plated, or otherwise formed on exposed routing features 52 provided on interposer 36 of SMD module 26. Formation of electrically-conductive bodies on the exposed interposer routing features 52 can be performed prior to or after placement of SMD modules 26, 28, and 30 on temporary substrate 22. In the illustrated example, solder balls 60 (one of which is shown in FIG. 3) are deposited on the exposed routing features 52 after placement of interposer 36 on temporary substrate 22. Solder balls 60 can be solid solder balls or solder-plated metal spheres (both considered "solder balls" in the context of the present document). As will be described more fully below, solder balls 60 can cooperate with routing features 52 of SMD module 26 to provide electrically conductive paths (effectively pre-placed via structures) extending between the frontside and backside of the molded body of SiP 20, when completed. Solder balls 60 can be deposited to have an oblong or vertically-elongated spherical shape, as indicated in FIG. 3; however, this is not necessary.

An overmolding or panelization process is next carried-out while semiconductor die 24, SMD module 26, SMD module 28, SMD module 30, individually-placed SMD 32, and the other non-illustrated microelectronic devices and modules are supported by temporary substrate 22. In one overmolding or panelization process, a mold frame having a central cavity or opening is positioned around the semiconductor die, SMD modules, and individually-placed SMDs supported by substrate 22. An electrically-insulative encapsulant or mold compound, such as a silica-filled epoxy, is then dispensed into the cavity of the mold frame. The encapsulant flows over and around semiconductor die 24, SMD module 26, SMD module 28, SMD module 30, and individually-placed SMD 32. The encapsulant can then solidified by thermal curing (e.g., heating in a partially-evacuated chamber) to yield a solid panel in which die 24, SMD module 26, SMD module 28, SMD module 30, SMD 32, and the other non-illustrated die, SMD modules, and other microelectronic components are embedded. In further embodiments, the panel can be produced utilizing various other known fabrication techniques including, for example, compression molding and lamination processes.

Figure 4:
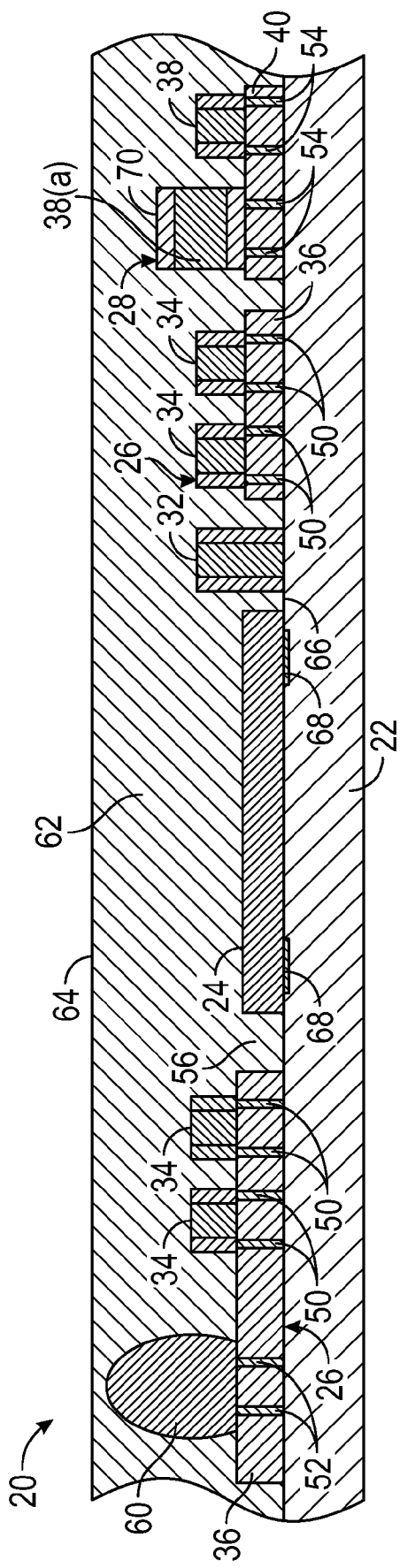

FIG. 4 illustrates a portion of a molded panel 62 that may be produced pursuant to the above-described encapsulation or panelization process. While only the portion of molded panel 62 containing semiconductor die 24, SMD module 26, SMD module 28, SMD module 30, and individually-placed SMD 32 is shown in FIG. 4 for clarity, it will be understood that molded panel 62 will typically be considerably larger than the illustrated portion of panel 62 and will contain various other encapsulated microelectronic components, such as other die placed in predetermined groupings with other SMD modules and individually-placed SMDs similar to those illustrated in FIG. 4. Molded panel 62 is produced to include a backside surface 64 and an opposing frontside surface 66, which are the upper and lower surfaces shown in FIG. 4, respectively. Contact points to the routing features of SMD modules 26, 28, and 30 are exposed at frontside 66 of molded panel 62, along with bond pads 68 of semiconductor die 24, and the electrically-conductive end terminals of individually-placed SMD 32. At this juncture in the fabrication process, solder balls 60 and high profile SMD 38(*a*) are covered by a relatively thin layer of overburden of the panel body and are, thus, not yet exposed through backside 64 of panel 62.

Figure 5:
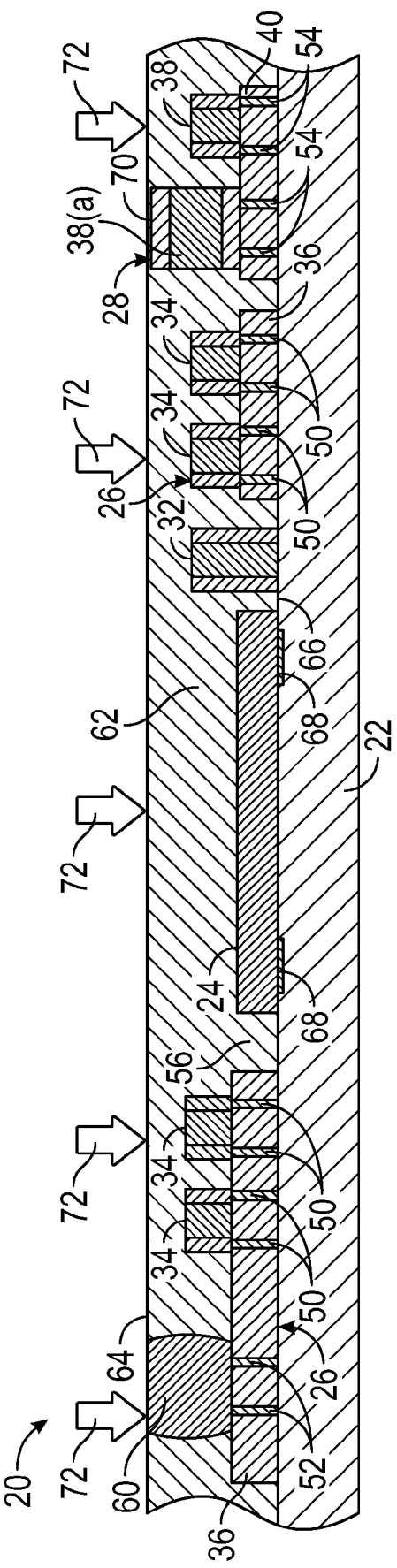

Material is next removed from backside 64 of panel 62 to reveal solder balls 60 and terminal 70 of high profile SMD 38(*a*). In certain embodiments, a relatively limited amount of material can be selectively removed by, for example, localized grinding to create small cavities in backside 64 exposing SMD terminal 70 and solder balls 60. Alternatively, as indicated in FIG. 5 by arrows 72, a global material removal process or panel thinning process can be performed during which material is removed from across the entire backside 64 of panel 62 to expose SMD terminal 70 and solder balls 60. Specifically, a global material removal process can be performed across backside 64 of panel 62 to expose the outer face or endwall of terminal 70 of vertically-orientated SMD 38(*a*), as well solder balls 60. Such a global material removal process can be carried-out utilizing any technique suitable for removing a predetermined thickness from molded panel 62 within acceptable tolerances. Suitable processes include grinding or chemical mechanical planarization ("CMP"). The amount of material removed from molded panel 62 will vary amongst embodiments, as will the final thickness of panel 62. In one embodiment, molded panel 62 has a final thickness between about 100 and about 3000 μm after thinning; although the final thickness of panel 62 can be thicker or thinner than the aforementioned range in further embodiments. The panel thinning process can remove some material from terminal 70 of high profile SMD 38(*a*). Additionally, the panel thinning process can simultaneously remove upper portions of solder balls 60 to provide relatively large surface areas or "landing pads" facilitating subsequent interconnection.

The above-described global material removal process can impart backside 64 of panel 62 with a substantially planar topology in certain embodiments; that is, a surface roughness of less than about 30 μm, preferably less than about 1 μm, and, more preferably, less than about 0.5 μm. If desired, the backside material removal process can be carried-out in multiple steps or stages. For example, in one implementation of the fabrication process, an initial bulk removal grinding step can first be carried-out utilizing a pad or paper having a relatively coarse grit, and followed by a final grinding step performed utilizing a pad or paper having a relatively fine grit to impart molded panel 62 with a relatively planar surface finish. In embodiments wherein the material removal process imparts panel 62 with substantially planar backside surface (again, defined as a surface having a roughness or feature height less than about 30 μm), the material removal process may also be referred to as a "planarization process" herein.

Figure 6:
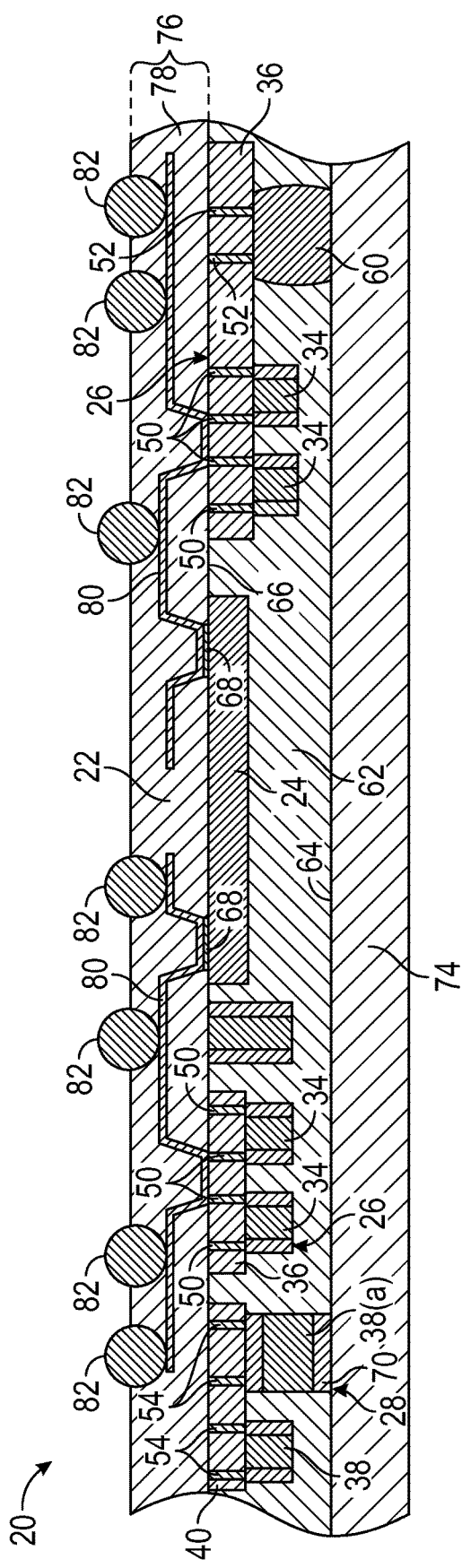

Advancing to FIG. 6, molded panel 62 is next thermally released or otherwise removed from temporary substrate 22, inverted, and attached to a carrier 74 or other support structure. With frontside 66 of panel 62 now facing upwards, one or more Redistribution Layers (RDLs) can be produced over frontside 66 of panel 62 to yield RDL structure 76 shown in FIG. 6. RDL structure 76 can be produced by spinning-on or otherwise depositing one or more dielectric layers to produce a dielectric body 78. Electrically-conductive (e.g., metal) interconnect lines 80 are produced in dielectric body 78 and can be interspersed with the deposited dielectric layers as a single metal level or multiple metal levels. Interconnect lines 80 can be produced utilizing well-known lithographical patterning and conductive material deposition techniques. In one embodiment, interconnect lines 80 are produced by patterning a mask layer deposited over a seed layer, plating exposed regions of the seed layer with copper or another metal, and then removing the mask layer to define interconnect lines 80. After formation of frontside RDL layers 58, openings can be formed in the uppermost RDL layer (e.g., a solder mask layer) by lithographical patterning to expose selected regions of frontside interconnect lines 80. A frontside contact array, such as a BGA containing solder balls 82, can then be produced over the frontside of partially-completed SiP 20 and in ohmic contact with the exposed regions of interconnect lines 80 utilizing a ball attach process.

Figure 7:
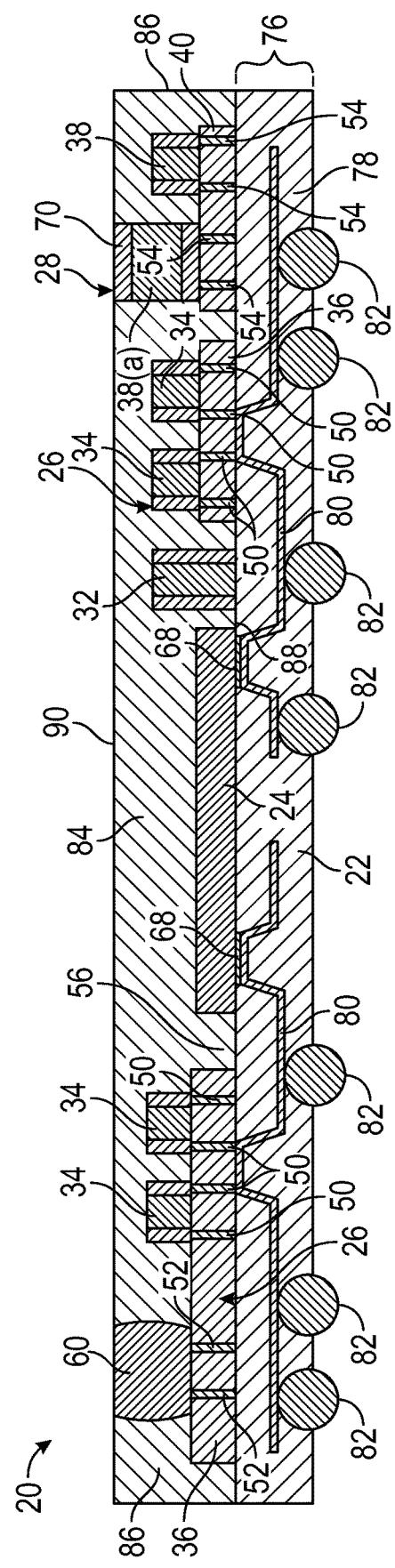

Molded panel 62 is next singulated to complete fabrication of SiP 20 and the other SiPs produced in parallel therewith. Panel singulation can be performed utilizing a dicing saw, utilizing laser cutting, by scribing and punching, or utilizing another singulation technique. FIG. 7 illustrates SiP 20 in a completed state after separation from panel 62. The singulated piece of molded panel 62 included within completed SiP 20 is identified by reference numeral "84" in FIG. 7 and is referred to below as "molded package body 84." As can be seen, molded package body 84 includes vertical package sidewalls 86, which have been defined by singulation of panel 62; a frontside 88 over which RDL structure 76 is formed; and a backside 90 to which solder balls 60 and high profile SMD 38(a) extends. The areas of solder balls 60 and SMD 38(a) exposed through backside 90 thus serve as backside contacts in the illustrated example to, for example, facilitate connection of SiP 20 with another microelectronic package or device in a Package-on-Package (PoP) configuration, such as that described below in conjunction with FIG. 8. SiP 20 further contains a plurality of SMD modules 26, 28, and 30 (FIG. 1), which each carry a plurality of SMDs electrically interconnected with die 24 through interconnect lines 80. Die 24 can be positioned within die cavity 56 provided in SMD module 26 and, therefore, surrounded or circumscribed by the plurality of SMDs 34 carried by module 26. By virtue of integration such a large number of SMDs 34, 36 (FIG. 1), and 38 into SiP 20 utilizing preassembled SMD modules 26, 28, and 30, the duration and cost of the fabrication process utilized to produce SiP 20 is reduced. Concurrently, the likelihood of failing to establish electrical contact with the SMDs carried by modules 26, 28, and 30 is minimized to boost package throughput.

Figure 8:
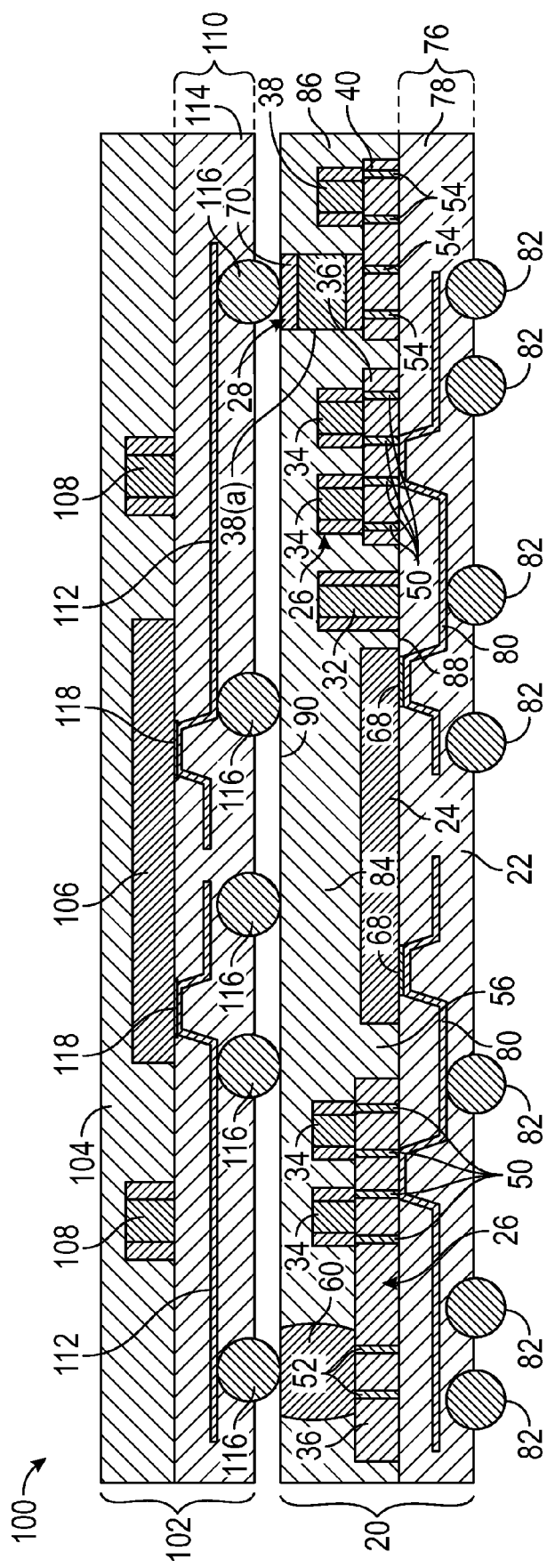
FIG. 8 is a cross-sectional view of a Package-on-Package assembly that can be produced utilizing the SiP shown in FIGS. 1-7, as illustrated in accordance with a further exemplary embodiment of the present invention.

FIG. 8 is a cross-sectional view of a stacked package assembly 100 that can be produced by disposing SiP 20 with an upper microelectronic package 102 in a Package-on-Package (PoP) configuration. In this particular example, package 102 is another SiP produced utilizing a FO-WLP fabrication process. Upper package 102 includes a molded package body 104 in which a semiconductor die 106 and other microelectronic components (e.g., SMDs 108) have been embedded. An RDL structure 110 is further produced over package body 104 and contains interconnect lines 112 formed within a dielectric body 114. Interconnect lines 112 provide electrical communication between BGA solder balls 118 produced over RDL structure 110, bond pads 120 of semiconductor die 106, and embedded SMDs 108. BGA solder balls 118 have also been soldered to backside contacts of lower SiP 20 in the form of the backside-exposed regions of solder balls 60 and high profile SMD 38(a). In further embodiments wherein SiP 20 can be electrically interconnected with a different type of package to produce package assembly 100, such as a package produced utilizing a Wafer Level Chip-Scale Packaging (WL-CSP), a Molded Array Process Ball Grid Array (MAPBGA), a Flip-Chip Ball Grid Array (FCBGA), or a sawn Quad-Flat No-Lead (QFN) packaging approach, to list but a few examples. In still further embodiments, the backside contacts of SiP 20 can be utilized to provide electrical connection to other structures or devices produced on, mounted to, or otherwise disposed over backside 90 of SiP 20, such as backside RDLs, a backside contact array, an RF antenna structure, an RF shield, one or more SMDs mounted to backside 90, and so on.

There has thus been described multiple exemplary embodiments of a fabrication process suitable for producing an SiP including one or more preassembled SMD modules. The SMD module or modules each carry multiple SMDs, which have been previously soldered or otherwise electrically joined to an interposer substrate. Production of the preassembled SMD modules can be performed by the SiP manufacturer itself or by a third party supplier, such as PCB assembly house. The usage of such SMD modules negates or at least greatly reduces placement iterations during pre-panelization placement and allows highly accurate placement of the larger modules. In so doing, the duration and cost of SiP manufacture can be reduced as a result, while SiP throughput can be increased. The SMD modules can be produced to have a wide variety of shapes and dimensions to provide a high level of design flexibility allowing the SMD modules to be utilized across different SiP platforms in an interchangeable or highly modular basis. Additionally, the usage of such a SMD-populated interposer substrate can ease the material constraints placed on the SMD termination finishes that can otherwise be imposed by the panelization process; e.g., SMDs terminated in Sn and other non-precious metals can be utilized, which tend to be less costly and more readily available than are SMDs terminated in Au, Cu, and other such materials. Finally, as a yet another advantage, high profile electrically-conductive members (e.g., solder balls or larger SMDs) can be positioned or formed at selected locations on the interposer of an SMD module to provide electrically-conductive paths extending between the frontside and backside of the molded package body of the completed SiP.

In one embodiment, the above-described SiP fabrication method includes positioning a first preassembled SMD module and a semiconductor die in predetermined spatial relationship, the first preassembled SMD module including a plurality of SMDs soldered or otherwise electrically joined to routing features (e.g., plated or conductor filled vias) of an interposer substrate. The first preassembled SMD module and the semiconductor die are then overmolded to yield a molded panel having a frontside at which the first preassembled SMD module and the semiconductor die are exposed. An RDL structure is then formed over the frontside of the molded panel and contains interconnect lines electrically coupling the semiconductor die and the first preassembled SMD module. Lastly, the molded panel to produce an SiP having a molded body in which the semiconductor die and the first preassembled SMD module are embedded.

Embodiments for fabricating SMD modules for inclusion in SiPs have also been provided. In one embodiment, the method includes providing an interposer substrate having electrically-conductive routing features formed on a dielectric substrate, placing a plurality of SMDs on the interposer substrate and in contact with the electrically-conductive routing features, and performing a solder reflow process to solder the plurality of SMDs to the interposer substrate and yield the SMD module. In an embodiment, each of the plurality of SMDs can be selected from the group consisting of a discrete capacitor, a discrete resistor, and a discrete inductor. In another embodiment, the interposer substrate can be produced or selected to have a ring-shaped geometry in which a die cavity is provided.

Embodiments of a SiP have further been provided. In one embodiment, the SiP includes a molded package body having a frontside and an opposing backside. A semiconductor die is embedded in the molded package body A preassembled SMD module is further embedded within molded package body adjacent the semiconductor die. The preassembled SMD module includes an interposer substrate, and a plurality of SMDs soldered or otherwise electrically joined to electrically-conductive routing features of the interposer substrate. Finally, an RDL structure is formed over the frontside of the molded package body. The RDL structure contains interconnect lines electrically coupling the semiconductor die and the preassembled SMD module. In an embodiment, the plurality of SMDs can each be selected from the group consisting of a discrete capacitor, a discrete resistor, and a discrete inductor. In a further embodiment, the preassembled SMD module can extend around the semiconductor die. Finally, in a still further embodiment, the SiP can include a plurality of solder balls deposited onto the interposer substrate and extending from the interposer substrate to the backside of the molded package body; and the interposer substrate can include a second plurality of electrically-conductive routing features electrically coupled to the plurality of solder balls to provide electrically-conductive paths through the molded package body.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a System-in-Package (SiP), comprising:
   positioning a first preassembled Surface Mount Device (SMD) module and a semiconductor die in predetermined spatial relationship, the first preassembled SMD module including a plurality of SMDs electrically joined to routing features of an interposer substrate;
   overmolding the first preassembled SMD module and the semiconductor die to yield a molded panel having a frontside at which the first preassembled SMD module and the semiconductor die are exposed; and
   forming, over the frontside of the molded panel, interconnect lines electrically coupling the semiconductor die and the first preassembled SMD module.

2. The method of claim 1 further comprising singulating the molded panel to produce an SiP having a molded body in which the semiconductor die and the first preassembled SMD module are embedded.

3. The method of claim 1 wherein the plurality of SMDs is soldered to the interposer substrate prior to positioning the first preassembled SMD module in a predetermined spatial relationship with the semiconductor die.

4. The method of claim 1 wherein first preassembled SMD module comprises an opening around which the interposer substrate extends, at least in substantial part, and wherein positioning comprises placing the semiconductor die in the opening.

5. The method of claim 1 wherein the interposer substrate of the first preassembled SMD module has a block shaped planform geometry, and wherein the positioning comprises placing the semiconductor die adjacent the first preassembled SMD module.

6. The method of claim 1 wherein the interposer substrate of the first preassembled SMD module has a substantially elliptical planform geometry, and wherein the positioning comprises placing the semiconductor die adjacent the first preassembled SMD module.

7. The method of claim 1 further comprising:
   prior to overmolding the first preassembled SMD module and the semiconductor die, forming electrically-conductive bodies in contact with electrically-conductive routing features of the interposer substrate; and
   after overmolding the first preassembled SMD module and the semiconductor die to yield the molded panel, removing material from a backside of the molded panel to expose the conductive bodies and provide electrically-conducive paths extending from the frontside of the molded panel, through the electrically-conductive routing features, through the electrically-conductive bodies, and to the backside of the molded panel.

8. The method of claim 7 wherein forming electrically-conductive bodies comprises depositing solder balls onto selected locations of the interposer substrate.

9. The method of claim 8 further comprising depositing the solder balls at locations adjacent the plurality of SMDs.

10. The method of claim 8 wherein removing material from the backside of the molded panel comprises grinding the backside of the molded panel to remove a predetermined thickness therefrom, while further removing portions of the solder balls.

11. The method of claim 1 further comprising selecting each of the plurality of SMDs from the group consisting of a discrete capacitor, a discrete resistor, and a discrete inductor.

12. The method of claim 1 further comprising positioning a second preassembled SMD module adjacent the first preassembled SMD module and the semiconductor die prior to overmolding, and electrically interconnecting the second preassembled SMD module.

13. A method for fabricating a Surface Mount Device (SMD) module for inclusion in a System-in-Package (SiP), the method comprising:
   providing an interposer substrate having electrically-conductive routing features formed on a dielectric substrate, wherein the dielectric substrate has a ring-shaped geometry in which a die cavity is provided;
   placing a plurality of SMDs on the interposer substrate and in contact with the electrically-conductive routing features; and
   performing a solder reflow process to solder the plurality of SMDs to the interposer substrate and yield a SMD module.

14. The method of claim 13 further comprising selecting each of the plurality of SMDs from the group consisting of a discrete capacitor, a discrete resistor, and a discrete inductor.

15. A System-in-Package (SiP), comprising:
a molded package body having a frontside and an opposing backside;
a semiconductor die embedded in the molded package body;
a preassembled Surface Mount Device (SMD) module embedded within molded package body adjacent the semiconductor die, the preassembled SMD module comprising:
   an interposer substrate having a first plurality of electrically-conductive routing features; and
   a plurality of SMDs electrically joined to the electrically-conductive routing features of the interposer substrate; and
interconnect lines formed over the frontside of the molded package body, the interconnect lines electrically coupling the semiconductor die and the preassembled SMD module.

16. The SiP of claim 15 wherein the plurality of SMDs each comprise terminals soldered to the first plurality of electrically-conductive routing features of the interposer substrate.

17. The SiP of claim 15 wherein the plurality of SMDs are each selected from the group consisting of a discrete capacitor, a discrete resistor, and a discrete inductor.

18. The SiP of claim 15 wherein the preassembled SMD module extends around the semiconductor die.

19. The SiP of claim 15 further comprising a plurality of solder balls deposited onto the interposer substrate and extending from the interposer substrate to the backside of the molded package body, and wherein the interposer substrate comprises a second plurality of electrically-conductive routing features electrically coupled to the plurality of solder balls to provide electrically-conductive paths through the molded package body.

* * * * *